United States Patent [19]

Swerlein

[11] Patent Number: 5,260,647

[45] Date of Patent: Nov. 9, 1993

[54] MEASURING AN AC SIGNAL VALUE WITH SAMPLING WHEN THE SAMPLING INTERVAL DOES NOT EXACTLY DIVIDE THE AC SIGNAL'S PERIOD

[75] Inventor: Ronald L. Swerlein, Longmont, Colo.

[73] Assignee: Hewlett-Packard Company, Palo Alto, Calif.

[21] Appl. No.: 762,520

[22] Filed: Sep. 18, 1991

[51] Int. Cl.⁵ .............................................. H03M 1/12
[52] U.S. Cl. ................................ 324/111; 324/99 D; 324/76.12; 341/123; 341/122; 328/151; 328/165
[58] Field of Search ................ 341/122, 123; 328/150, 328/151, 165; 324/99 D, 111, 120, 121 R, 77 R

[56] References Cited

U.S. PATENT DOCUMENTS

| | | | |
|---|---|---|---|
| 4,694,244 | 9/1987 | Whiteside | 324/121 R |
| 4,768,017 | 8/1988 | Gordon | 341/122 |
| 4,791,404 | 12/1988 | Hollister | 324/102 |

*Primary Examiner*—Kenneth A. Wieder
*Assistant Examiner*—Jose M. Solis
*Attorney, Agent, or Firm*—Edward L. Miller

[57] ABSTRACT

An AC input signal is sampled with a plurality of sets of equally spaced samples, but whose sample interval between the samples does not exactly divide the period of the input signal. Nevertheless, and error cancellation technique allows ultra accurate measurements to be made. The samples in each set of the plurality of sets are supplied to a computational process that extracts some parameter; e.g., RMS voltage. The extracted parameter is in error, owing to the non aliquot nature of the sampling. The size of the error is related to, among other things, where on the input waveform the associated set began. The error is a period AC function of that starting location. By arranging for n-many sets to start at phase differences of 1/n apart on the input waveform, a series of n-many parameter$_i$ are obtained that are each of the form [result$_i$+error$_j$]. Thus, the error$_i$ are sampled at aliquot locations along an error function, and therefore sum to zero. Thus, averaging the parameter$_i$ causes exact cancellation of the error$_i$, while at the same time increasing confidence in the result$_i$. What is more, using inexact sampling even when it might otherwise be avoidable is shown to produce a substantial reduction in errors caused by the aliasing of harmonics within the input waveform.

5 Claims, 1 Drawing Sheet

FIG 1

MEASURING AN AC SIGNAL VALUE WITH SAMPLING WHEN THE SAMPLING INTERVAL DOES NOT EXACTLY DIVIDE THE AC SIGNAL'S PERIOD

BACKGROUND AND SUMMARY OF THE INVENTION

Digital measuring techniques offer attractive alternatives to traditional analog methods for the measurement of AC signals. This is especially true where the sampling rate obtainable is high with respect to the period of the signal to be measured, and even more so if that "high" sampling rate is in fact low enough to permit the use of the high accuracy analog to digital conversion techniques used in the best laboratory grade voltmeters. In fact, for the measurement of low frequency AC signals (those of say, less than thirty or forty hertz) sampling offers additional advantages pertaining to avoiding the need for large valued coupling capacitances or low drift DC coupled circuitry. In principle, today's high accuracy fast DC voltmeters ought to be usable for making ultra high accuracy (in the vicinity of ten parts per million) measurements (e.g., RMS voltage) on low frequency AC signals of about a kilohertz or less in frequency. This degree of potential accuracy is simply beyond all but the most exotic analog techniques.

Digital techniques do, however, introduce their own special difficulties. Among these are issues arising from how well one can control when (i.e., at exactly what times) the samples occur. This is not trivial, since samples are often taken over what is assumed to be exactly one or an integral number of input signal cycles, for which the samples are then processed in an appropriate manner for the type of measurement desired. Since digital systems tend to run with timing controlled by internal clock circuits of fixed frequency (whose period may in fact be the precision quantity upon which the accuracy of the analog to digital conversion process is dependent!) the location of actual samples along a cycle of the input signal may not be convenient for the subsequent processing of the samples. What is more, it may not be possible to shift those locations to be convenient.

For example, the method of measurement may require that the samples (1) be equally spaced; and (2) that the number of samples taken match exactly one cycle of the signal to be measured. (That is, the sample-to-sample interval exactly divides the signal period; such sampling may be termed aliquot sampling.) The first requirement of equal spacing of the samples is not generally a problem, but the second requirement can cause considerable trouble. This trouble arises because of the fixed frequency clocked operation and internal overhead for control of the analog to digital conversion process on the one hand, and on the other hand because of the ability of the signal being measured to have a totally arbitrary period. As a specific example, it may be possible to cause the analog to digital converter to space its samples in increments of hundredths or tenths of a second, but this won't meet the second requirement above if the frequency of the signal to be measured is, say, exactly three hertz. The resulting error can be quite significant.

A common cure for the difficulty of the sample interval not exactly dividing the signal period is to make the measurement over a plurality of consecutive signal periods. Either the sample interval will exactly divide (or almost exactly divide) the plurality of periods, in which case the error is never introduced and the answer is the average of the plurality, or the inexactitude remains as before but is now distributed across the contributions of each of the cycles in the average, and is thus reduced according to the number of periods in the average.

There are some disadvantages with this approach, however. Suppose that the signal period is long, say several seconds or several tens of seconds. Further, it may be that the sample interval and the signal period are such that several hundred, or even a thousand or so, signal periods would be needed to minimize the effects of inexact division by the sample interval. Not only is this inconvenient because of the time required to make the measurement, but it raises some other sticky issues relating to stability: has either the signal or the analog to digital conversion mechanism changed over the course of the measurement?.

In accordance with the invention described herein, it is possible to accurately measure an AC input signal with sampling even though the available sampling intervals do not exactly divide the period of the AC signal to be measured, and to do so without averaging over a plurality of periods which is exactly divisible (or nearly so) by the sampling interval. The invention exploits the observation that regular but inexact sampling for a group of samples over one cycle of the AC input signal produces an answer that can be decomposed into a result+error. The magnitude of the error is a periodic AC function, and its effect will be distributed over successive groups of samples. Thus, if several such answer$_i$ are found such that their corresponding error$_i$ are from locations equally and aliquotly spaced along the period of the error function, the average of the answer$_i$ will be simply the average of the result$_i$. That is because the error$_i$ will sum to zero (be self-canceling) during the averaging. This aliquot spacing of the error$_i$ can be obtained by aliquot spacing upon the input waveform of the start of the groups of samples. That is, if six groups of samples are to be taken, then each group starts one sixth of an input signal period further along the phase of the input signal than it predecessor.

Deliberate selection of a sampling interval that does not exactly divide the period of the signal to be measured has advantages even when such division would otherwise be possible. Proper selection of an inexact sampling interval can ensure that lowest harmonic component that is aliased by the sampling is ridiculously high in number, thus guaranteeing that all harmonics below a certain number are accounted for by the sampling process, even though the sampling does not strictly meet the Nyquist theorem's requirements for those harmonics. Instead, those harmonics produce errors in the intermediate answers. Those errors can also be made self-canceling by the aliquot spacing of the starting points of the pluralities of the samples upon input waveform.

DESCRIPTION OF A PREFERRED EMBODIMENT

Figure 1:
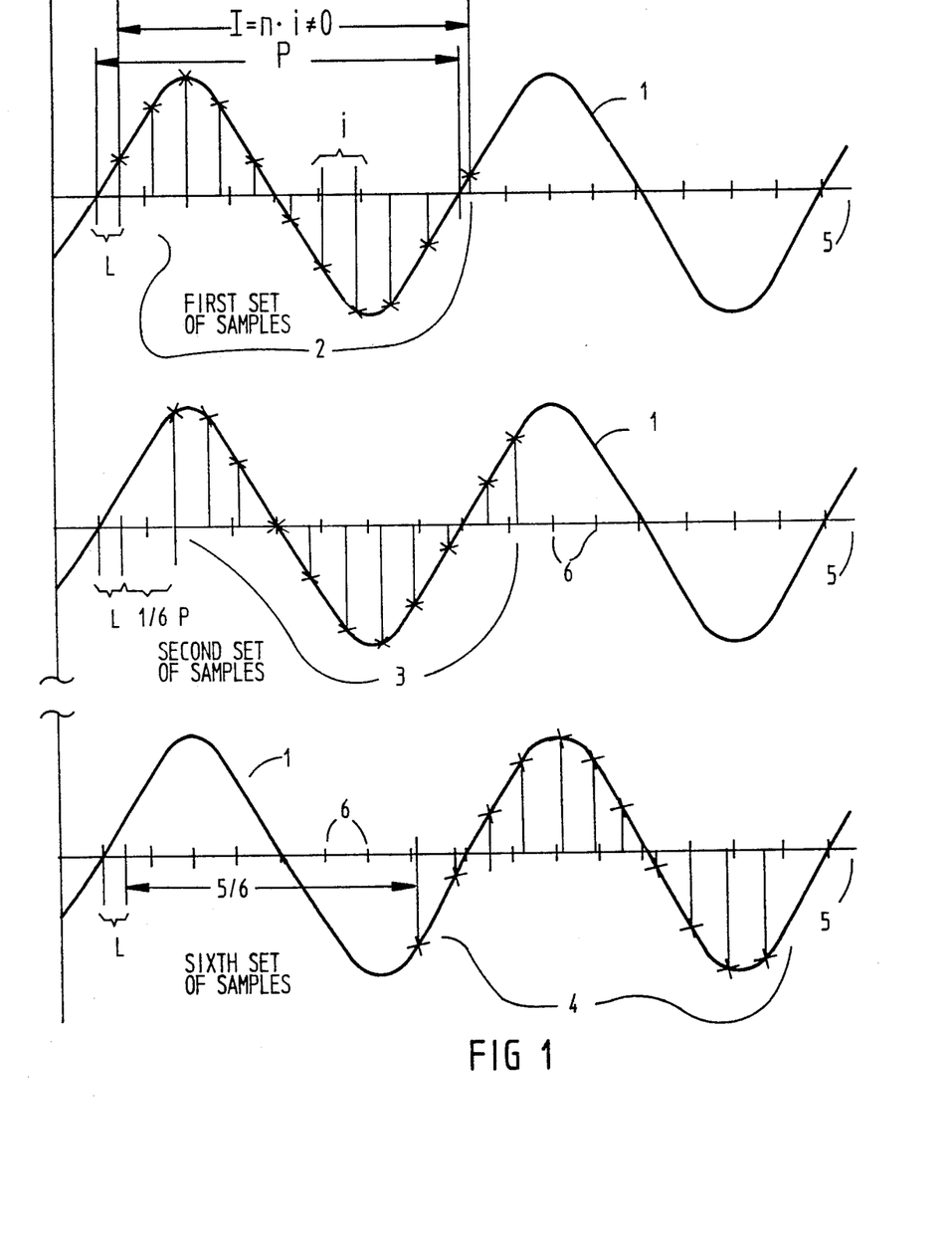
FIG. 1 is waveform diagram illustrating the method of taking samples of a waveform in accordance with the principles of the invention.

Refer now to FIG. 1, wherein are shown several portions (2, 3, 4) of an input waveform 1 that is to be measured. For the sake of brevity we shall assume that the input waveform is sinusoidal and that it possibly has some harmonic distortion. It will be understood that portions 2, 3 and 4 are all part of the same input waveform signal 1, differing only in that they occur at different times. That is, the portions 2, 3 and 4 are shown as occurring at separate locations along a common time axis 5. For convenience the time axis 5 includes tic marks 6 that are spaced ⅛ cycle (forty-five degrees) apart, and which are coincident with the zero crossings of the input waveform 1 that is to be measured. The vertical lines that extend from the abscissa or time axis to the waveform 1, and that end with x's thereupon, indicate by their position along the abscissa the relative locations along the input waveform 1 where samples are taken, and indicate by their length and direction the value of the sample obtained.

It will be understood that the input waveform 1 is applied to a suitable device for making the samples. That device might be, for example, a precision laboratory grade voltmeter such as the Hewlett-Packard 3458A Multimeter. It will be further understood that the sampling device is suitably controlled in a way that is to be described. In the case where the sampling device is an HP 3458A Multimeter, the control can be a program written in BASIC and executed by a suitable computer connected to the voltmeter via an IEEE-488 bus. A listing of such a program is included in an Appendix herewith. For whatever assistance it may provide in understanding how the program in the Appendix operates, the *Operating, Programming and Configuration Manual* for the HP 3458A Multimeter is hereby incorporated by reference. The Hewlett-Packard part number is 03458-90001, and it was published in May of 1988.

As part of the cooperation between the sampling device and its controller, the sampling device may transfer the sample values obtained to the controller, where various computations are performed, depending upon the measurement that is of interest. In the case of the HP 3458A Multimeter and the BASIC program in the Appendix, the measurement is RMS value, and the computer can be any that will run HP BASIC and that supports an HPIB (IEEE-488) interface.

Referring again to FIG. 1, note that the period of the input waveform 1 is denoted by P. The value of P must be known, and in the case of the BASIC program of the Appendix, the user is (sometimes) prompted for the frequency of the input waveform so that the program can determine P's value (in cases where the HP 3458A can't measure it directly).

Note also that the interval between samples (the sample interval) is denoted by i. The value of i is determined by a combination of factors that include the capabilities of the device that is to do the sampling and the period P of the input waveform 1. As discussed in the Background and Summary, it is seldom the case that for arbitrary frequencies the sample interval i can be selected such that it will exactly divide P. Accordingly, FIG. 1 shows that for some integer n the product of n and i is some value I which approximates P, but which does not equal P. Once P is known, values for n and i are selected. It will be understood that selecting n and i such that I is approximately equal to 2P (or 3P, 4P or even 90 or 100P) instead of P, is equivalent to using P provided the measurement computations are adjusted as needed.

As will become clear, n and i need not have particular values; a wide ranges of values are generally suitable. In general, the larger n is, the better. Nyquist considerations and the presence of harmonics can put a lower limit on n. Perhaps a reasonable lower limit for n in high accuracy situations is around one hundred.

As will be discussed further below, the inequality between P and I is in certain respects desirable. The reason for this has to do with ensuring accurate measurement of harmonic content possessed by the input waveform I.

Here then, is a description of how the samples are located along the input waveform 1. First, notice that the samples are grouped into pluralities of samples, with one plurality per portion (2, 3, 4). For the sake of brevity we assume that a "portion" corresponds to one cycle's worth of the input waveform 1. Bear in mind, however, that a "portion" might be several cycles worth; perhaps even a relatively large number of cycles. In FIG. 1 these pluralities of samples upon a portion are called sets. The first set of samples is taken along the first portion 2. The second set of samples is taken along the second portion 3. The number of portions and associated sets of samples is somewhat flexible, although not altogether arbitrary. We shall have more to say about the number of portions and their associated sets at a later time. Six, however, is a reasonable number of portions, and that is what is represented in FIG. 1. Therein the third, fourth and fifth portions and their associated sets of samples are omitted for the sake of brevity. However, waveform segment 4 represents the sixth portion and its associated sixth set of samples made thereon.

Consider the first set of samples. A particular feature of the input waveform 1 is selected as a periodically occurring point of reference. Say, for example, the zero crossing in the negative to positive direction. This periodically occurring point of reference must from time to time be detected, as needed. In the case of the HP 3458A Multimeter and the program of the Appendix, the negative to positive zero crossing is detected with a "level trigger" feature of the HP 3458A Multimeter. After the occurrence of the point of reference there occurs a period of latency L that precedes the taking of the first sample of the first set of samples. The period of latency is simply how long the measurement/control system takes to accomplish a measurement after having detected the periodic point of reference. In FIG. 1 the period of latency L is greatly exaggerated.

Following the period of latency L there occurs the first set of samples. These samples are equally spaced along the time axis, with a sample interval of i. There are n sample intervals, and product of n and i is I, which is close in value to P (or to whatever multiple of P comprises a "portion" of the input signal 1), but preferably does not equal P. Now, n-many intervals have (n+1)-many points (since there are two endpoints). Of these (n+1)-many we are interested in only n-many consecutive samples, so discard one of the end points, say, the last or right-hand one. These are the n-many samples of the first set of samples. The first set of samples is taken as described and given to the computational process. The computational process will be described further on below.

The second set of samples is taken in a manner similar to that used to take the first set. It is, however, taken upon a different portion 3 of the input waveform which portion 3 occurs at a different time than does portion 2 and the first set of samples. The essential difference is this. Assuming that six sets of samples are to be made upon six portions, following the period of latency L one sixth of P is additionally waited before taking the first sample of the second set of samples. (The wait, or delay, is 1/6 P and not 1/6 of a portion if a portion is more than one cycle.) Except for the delay (and that it is happening upon a different portion of the input waveform 1) the second set of samples is obtained much like the first. The second set of samples is also given to the computational process.

The third set of samples (not shown) is obtained in the same way as the second set 3, except that two sixths of a period P occur after the period of latency L and the first sample of the set. For each successive set of samples there is an increased delay of one sixth of a period P, until for the sixth set 4 there is a delay of five sixths of a period P between the period of latency L and the first sample. Each set of samples is given to the computational process.

In general, if there are to be K sets of samples, then the starting points of these sets are equally phased apart by an amount (in time) equal to P/K. It will be clear after the discussion that follows that the order in which the different sets of samples are taken, is in general, of no particular interest save for the convenience of one order as compared to another.

In the case where the program in the Appendix and an HP 3458A Multimeter are used to take the samples (and thence compute an RMS voltage value) K is user selectable, and the various delays P/K, 2P/K, 3P/K, . . . are realized by the program's instructing the Multimeter to wait past the zero crossing by the particular delay needed for the set of samples to be taken.

The preceding is a description of how sets of samples are taken. We now describe the general way in which they are used. The fundamental idea is this: Each set of samples is in error by some amount. The error is a periodic AC quantity, and different sets of samples will have different errors. By correctly relating the several sets of samples the errors can be made to cancel.

The reason for the error is that the sample interval i does not exactly divide the period P of the input signal 1. It is not so much that the samples themselves are inaccurate; it is more that the algorithm relating the samples to some property (say, the RMS voltage value) of the input waveform 1 assumes or requires that the sample interval i exactly divide the signal period P. Thus, such non-aliquot sample sets as described above and in FIG. 1 are "inappropriate" (or so it has been thought until now) for certain kinds of measurements.

Considering RMS voltage measurement as an example, it can be shown that difference between the computed RMS value for the sampled set and the presumed ideal value is a periodic AC quantity. (A rigorous demonstration of this is messy, and is omitted for the sake of brevity.) It is not hard to appreciate why this is so, however. The RMS formula of finding the square root of the mean of the squares of the samples is very much like the straight-forward numerical integration used to find the area under a digitized curve. (That is, summing the areas of rectangles whose widths are the sample interval and whose heights are determined by the curve.) Since I does not equal P, there is some portion of the curve (input signal 1) that is not correctly represented. Either there is some "extra contribution" if $I > P$ or some "missing contribution" if $I < P$. Assuming the start of the samples is where it ought to be, the tail end of the samples is where the trouble arises. Now look at the waveform. Where on the waveform that tail end falls makes a real difference, since that determines the magnitude of the extra or missing contribution. The magnitude of the missing or extra contribution is what maps into the error through whatever computational mechanism that is being used. Yet that initial magnitude is itself a period variation, by virtue of the nature of the input waveform 1.

This means that each of the several sets of samples 2, 3, 4 each include an error. It may be difficult to characterize the errors exactly. The amount of the error can depend on the size of the sampling interval i, as well as where along the input waveform the set of samples begins. It can also depend upon what harmonics are in the input waveform and how they are arranged. But, it is not necessary to know what theses errors are in particular if it can be assured that several sample sets can be taken in such a way that the errors therein are self-canceling. This can indeed be achieved by noting that the error is indeed a periodic AC signal, and by recalling that equally spaced samples along a periodic AC signal sum to zero.

What the successive application of the computational process to the successive sets of samples produces is a sequence of successive intermediate answers:

[result$_1$ + error$_1$]
[result$_2$ + error$_2$]
[result$_3$ + error$_3$]
[etc. etc.]

These may be averaged, so that the mean of the result$_i$ alone is obtained, since the error$_i$ sum to zero in the averaging process.

It can now be appreciated why the several sets of samples are spaced apart by equal amounts of phase delay upon the input waveform 1. Each set of samples amounts to sampling the periodic AC error function that is disturbing the result. By sampling the error at equally spaced intervals along its period the error adds to zero (becomes self-canceling). It can now also be appreciated how to select the number of sample sets. This has to do with the expected period of the error signal to be canceled. It is not necessarily the same as the frequency of the input signal 1. In the case of an RMS measurement, for example, the error signal induced at the level of the sampling (because the product of n and i does not equal P) has a period of P but still goes through the squaring process, where a component with period P/2 is created. If the error component were to be completely characterized at its own fundamental frequency, then according to Nyquist this would need to be sampled at a rate greater than twice its frequency, which would require at least five sets of samples. However, we don't need to characterize the error, and instead merely wish to avail ourselves of samples summing to zero on an AC waveform. That looser requirement only needs at least two equally spaced samples per period. Therefore, only four sets of samples are the minimum number needed. However, if the error signal itself has harmonic content that is to be accounted for, the number of sample sets may need to increased. (Six sets of samples are required for an RMS measurement when the original unsquared error signal itself includes a lowest order harmonic.)

The benefits of inexact sampling as described herein my be illustrated by an example. Suppose that ten aliquot samples were made upon a cycle of frequency F. Then the distortion term of frequency 5F will be sampled as if it were DC, and will produce a DC component in the result. This results in an error. However, if the sample interval were such that 10.1 samples per cycle were used, then the DC error would change to a slowly changing component. It then gets averaged out by the aliquot spacing of the several sets of samples. By taking 10.1 samples per cycle one hundred and one aliquot samples would occur over ten cycles. Now, the lowest distortion term that would be sampled as if it were DC would be the one whose frequency is 51F.

Introduction To the Appendix

Included are operating instructions and a listing of a program written in Hewlett-Packard BASIC that incorporates the previously described method. The program is for controlling an HP 3458A Multimeter to make ultra-accurate RMS voltage measurements.

Using the Program

The commonly modified variables are on LINE 200–280 and are the voltmeter address, the voltmeter DCV range, and the target measurement time. The voltmeter range should be picked so that a peak value of the input waveform will not overload the meter. The minimum voltage on a given range is what is necessary to operate the internal level trigger which has about 10% of range hysteresis. For example, the 10V range should be able to measure AC voltages from 1V to 7V. Measurement time is pretty self explanatory, longer times give higher accuracy.

When the program is run, the user is asked to apply the input signal and allow it to settle and then to press "CONT" (a key on a series 200 or 300 HP computer's keyboard). If the input frequency is less than 0.5 Hz, there will be a prompt for it's frequency. This value should be known to within 0.02% or so. Next, the program prints out this frequency, a list of the sampling parameters, and an estimate of measurement uncertainty. Then the intermediate and final results are printed. Pressing "CONT" will generate another measurement, but the sampling parameters will still be the same. This is useful for observing measurement repeatability. If a signal with a different frequency is to be measured the program should be re-run.

The less commonly modified variables are on line 290–390. If Forecefreq is 1, the program prompts the user for the input signal frequency instead of automatically looking. This is convenient for frequencies below 0.5Hz where the HP 3458A can't measure frequency. Otherwise 1.5 sec is wasted before the program realizes that it can't measure it and prompts the user. If Force=1, the sampling parameters on lines 330–350 are forced. In general, Tsampforce*Numforce are set to be an integral multiple of the period of the input signal. Keep in mind that it is possible to generate inaccurate measurements by forcing the wrong sampling parameters. This can also occur if a wrong or inaccurate input frequency is entered after the frequency prompt.

Nharm (line 370) is the minimum number of input signal harmonics that will be passed without aliasing before the program automatically speeds up its sampling. (At least 2*Nharm samples are forced to be present in each period of the input signal). If Nharm is too high, at higher input signal frequencies the A/D aperture will be forced to such a low value that the basic gain accuracy of the program will be degraded (the HP 3458A is less accurate with a short aperture than a long one). If Nharm is too low, small amounts of distortion may generate alias errors that can show up as measurement drift or error. A test for lack of alias error is to change Aper_target or Nharm or Nbursts slightly and verify that the measurement does not significantly change. In general, one shouldn't get too concerned about alias error with this program, it was designed to be highly resistant. The sample rate is picked so that 1/Tsamp is offset slightly from Nharm*Freq so as to resist aliasing up to 10*Nharm*Freq. Also, at these higher frequencies, the aperture of the A/D becomes an effective anti-alias filter. Nharm=6 is a good value.

Nbursts (line 380) selects the number of intermediate results that are used in computing the final result. Each intermediate result is computed from a burst of Num samples. Each burst of Num samples is delayed in time K/Freq/Nbursts from the input signal's zero crossing where K varies from 0 to Nbursts−1. Any value of Nbursts>=6 is good. Under some conditions, smaller Nbursts can be used. The purpose of using multiple bursts is to remove errors due to Num*Tsamp not being an exact integral number of periods in length and to further reduce sensitivity to aliasing.

```
10     !PROGRAM MEASURES LOW FREQ RMS VOLTAGES (<1KHZ)
20     !RE-STORE "GOOD_AC<RON>"
30     !
40     !CAN BE ACCURATE TO 0.001% IF Meas_time>30
50     !NOTES:
60     !1. DISTORTED SINEWAVES HAVE HIGHER FREQ HARMONICS
70     !    THAT MAY NOT BE MEASURED IF MEASUREMENT BANDWIDTH IS TOO LOW.
80     !    COMPUTED ERROR IS INCLUDED FOR UP TO 1% HARMONIC DISTORTION.
90     !    THIS ERROR CAN BE REDUCED BY USING SMALLER Aper_targ(LINE 360)
100    !2. ESPECIALLY AT LOW SIGNAL LEVELS, TWO AC VOLTMETERS WITH "PERFECT"
110    !    ACCURACY MAY READ DIFFERENTLY IF THEY HAVE DIFFERENT
120    !    NOISE BANDWIDTHS.  THIS IS TRUE ONLY IF THE SIGNAL BEING MEASURED
130    !    CONTAINS APPRECIABLE HIGH FREQUENCY NOISE OR SPURIOUS SIGNALS.
140    !    THIS PROGRAM DISPLAYS THE MEASUREMENT BANDWIDTH WHEN RUN.
150    !    THIS BANDWIDTH VARIES DEPENDING ON Freq.  IT IS APPROX= .5/Aper_targ.
160    !    ALSO, MAKING Nharm(LINE 370) HIGHER CAN INCREASE BANDWIDTH, BUT
170    !    CAN HURT BASIC ACCURACY BY FORCING SMALL A/D APERTURES.
180    !
190    !
200    !---------------------- MODIFIABLE VARIABLES
210    !
220    ASSIGN @Vmeter TO 722       !VOLTMETER ADDRESS
230    Range=10                    !VOLTMETER RANGE (.1,1,10,100,1000)
240    !                           !***RANGE MUST HANDLE > SIGNAL*CREST FACTOR
250    !                            i.e. Range=10 IS FOR 1V TO 7V RMS SINEWAVE
260    Meas_time=15                !TARGET MEASUREMENT TIME (SEC)
270    !
280    !
290    !---------------------- LESS COMMONLY MODIFIED VARIABLES
300    !
310    Forcefreq=0                 !1=INPUT FREQ. OF SIGNAL, 0= AUTOMATIC IF>1Hz
320    Force=0                     !1=FORCE SAMP. PARAMETERS, 0= AUTOMATIC
330    Tsampforce=.001             ! FORCED PARAMETER
340    Aperforce=Tsampforce-3.E-5! FORCED PARAMETER
350    Numforce=800                ! FORCED PARAMETER
360    Aper_targ=.001              !A/D APERTURE TARGET (SEC)
370    Nharm=6                     !MINIMUM # HARMONICS SAMPLED BEFORE ALIAS
380    Nbursts=6                   !NUMBER OF BURSTS USED FOR EACH MEASUREMENT
390    !-------------------------------------------------
400    !
410    OUTPUT 2 USING "#,B,B";255,75      !CLEAR DISPLAY
420    CLEAR @Vmeter
430    OUTPUT @Vmeter;"RESET;DCV 1000"
440    DISP "APPLY INPUT SIGNAL, LET SETTLE, PRESS CONT"
450    BEEP 2500,.05
460    PAUSE
470    DISP ""
480    OUTPUT @Vmeter;"DISP OFF,*GOOD_AC*"
490    IF Forcefreq=1 THEN                !IF MANUALLY ENTERING FREQUENCY
500       BEEP 2500,.1
510       INPUT "ENTER FREQ",Freq
520    ELSE
530       Freq=FNFreq(Range,@Vmeter)      !GET INPUT SIGNAL FREQUENCY
540    END IF
550    IF Force=1 THEN                    !IF NOT GETTING PARAMETERS AUTOMATICALLY
560       Tsamp=Tsampforce
570       Aper=Aperforce
580       Num=Numforce
590    ELSE                               !AUTOMATICALLY GET SAMPLING PARAMETERS
600       Samp_parm(Tsamp,Aper,Num,Freq,Meas_time,Aper_targ,Nharm,Nbursts)
610    END IF
620    !
630    !--------------------------------SETUP HP3458A
640    !
650    OUTPUT @Vmeter;"TARM HOLD;AZERO OFF;DCV ";Range
660    OUTPUT @Vmeter;"APER ";Aper;";NRDGS ";Num;",TIMER"
670    OUTPUT @Vmeter;"TIMER ";Tsamp
680    OUTPUT @Vmeter;"TRIG LEVEL;LEVEL 0,DC;DELAY 0;LFILTER ON"
690    OUTPUT @Vmeter;"MSIZE?"
700    ENTER @Vmeter;Storage
710    Storage=INT(Storage/4)      !STORAGE CAPACITY IN VOLTMETER (DINT DATA)
```

```
720   IF Num>Storage THEN
730     PRINT "******** NOT ENOUGH VOLTMETER MEMORY FOR NEEDED SAMPLES ***"
740     PRINT "          TRY A LARGER Aper_targ VALUE OR SMALLER Num"
750     BEEP 200,1
760     STOP
770   END IF
780   WAIT .1
790   !------------------------------------------
800   !
810   !-------------------------------- PRELIMINARY COMPUTATIONS
820   !
830   X=PI*Aper*Freq
840   Sinc=SIN(X)/X                        !USED TO CORRECT FOR A/D APERTURE ERROR
850   Bw_corr=FNVmeter_bw(Freq,Range)      !USED TO CORRECT FOR Vmeter BANDWIDTH
860   Err_est(Err,Dist_er,Freq,Range,Num,Aper,Nbursts)!MEASUREMENT UNCERTAINTY
870   IF Force=1 THEN
880     PRINT "****** PARAMETERS ARE FORCED, ACCURACY MAY BE DEGRADED! ******"
890   END IF
900   PRINT "SIGNAL FREQUENCY(Hz)= ";Freq
910   PRINT "Number of samples in each of";Nbursts;"bursts= ";Num
920   PRINT "Sample spacing(sec)= ";Tsamp
930   PRINT "A/D Aperture(sec)= ";Aper
940   PRINT "Measurement bandwidth(Hz)= ";INT(5/Aper)/10
950   PRINT "ESTIMATED TOTAL SINEWAVE MEASUREMENT UNCERTAINTY(ppm)= ";Err
960   PRINT "ADDITIONAL ERROR FOR 1% DISTORTION(3rd HARMONIC)(ppm)= ";Dist_er
970   PRINT "NOTE: ERROR ESTIMATE ASSUMES (ACAL DCV) PERFORMED RECENTLY(24HRS)"
980   !------------------------------------------
990   !
1000  !
1010  Start:PRINT ""
1020  OUTPUT @Vmeter;"DISP OFF,*GOD'S_AC*"
1030  PRINT "The";Nbursts;"intermediate results:"
1040  Begin=TIMEDATE
1050  Sum=0
1060  Sumsq=0
1070  FOR I=0 TO Nbursts-1
1080    Delay=I/Nbursts/Freq+1.E-6
1090    OUTPUT @Vmeter;"DELAY ";Delay
1100    OUTPUT @Vmeter;"TIMER ";Tsamp
1110    CALL Stat(Mean,Sdev,Num,@Vmeter)            !MAKE MEASUREMENT
1120    Sumsq=Sumsq+Sdev*Sdev+Mean*Mean
1130    Sum=Sum+Mean
1140    Temp=Sdev*Bw_corr/Sinc                      !CORRECT A/D Aper AND Vmeter B.W.
1150    Temp=Range/1.E+7*INT(Temp*1.E+7/Range)!6 DIGIT TRUNCATION
1160    PRINT Temp
1170  NEXT I
1180  Dcrms=SQR(Sumsq/Nbursts)
1190  Dc=Sum/Nbursts
1200  Acrms=Dcrms*Dcrms-Dc*Dc
1210  IF Acrms<0 THEN Acrms=0                       !PROTECTION FOR SQR OF NEG NUMBER
1220  Acrms=SQR(Acrms)
1230  Acrms=Acrms*Bw_corr/Sinc                      !CORRECT A/D Aper AND Vmeter B.W.
1240  Dcrms=SQR(Acrms*Acrms+Dc*Dc)
1250  End=TIMEDATE
1260  Acrms=Range/1.E+7*INT(Acrms*1.E+7/Range+.5)   !6 DIGIT TRUNCATION
1270  Dcrms=Range/1.E+7*INT(Dcrms*1.E+7/Range+.5)   !6 DIGIT TRUNCATION
1280  !
1290  !******************** PRINT RMS VALUES ***************
1300  PRINT "AC RMS VOLTAGE= ",Acrms
1310  PRINT "ACDC RMS VOLTAGE= ",Dcrms
1320  DISP USING "K,DDD.DDD";"PRESS CONT FOR NEW READING IF SAME FREQ, MEASUREMENT
1330  OUTPUT @Vmeter;"DISP OFF,";"'";Acrms;" VAC'"
1340  PAUSE
1350  DISP "".
1360  GOTO Start
1370  END
1380  SUB Stat(REAL Mean,Sdev,Num,@Vmeter)
1390    OUTPUT @Vmeter;"MEM FIFO;MFORMAT DINT;TARM SGL"
1400    OUTPUT @Vmeter;"MMATH STAT"
1410    OUTPUT @Vmeter;"RMATH SDEV"
1420    ENTER @Vmeter;Sdev
```

```
1430      OUTPUT @Vmeter;"RMATH MEAN"
1440      ENTER @Vmeter;Mean
1450      Sdev=SQR(Sdev*Sdev*(Num-1)/Num)         !CORRECT SDEV FORMULA
1460    SUBEND
1470    DEF FNFreq(Range,@Vmeter)
1480      OUTPUT @Vmeter;"TARM HOLD;LFILTER ON;LEVEL 0,DC;FSOURCE ACDCV"
1490      OUTPUT @Vmeter;"FREQ ";Range
1500      OUTPUT @Vmeter;"CAL? 245"
1510      ENTER @Vmeter;Cal                !FREQUENCY CAL VALUE
1520      OUTPUT @Vmeter;"TARM SGL"
1530      ENTER @Vmeter;Freq
1540      Freq=Freq/Cal                    !UNCALIBRATED FREQUENCY IS USED
1550      !                                 FOR MORE ACCURATE SAMPLE DETERMINATION
1560      !                                 SINCE TIMER IS UNCALIBRATED
1570      IF Freq=0 THEN
1580        BEEP 2500,.1
1590        INPUT "FREQ MEASUREMENT WAS 0, PLEASE ENTER THE FREQ",Freq
1600        IF Freq>1 THEN
1610          BEEP 200,.1
1620          PRINT "******************* WARNING!! *****************"
1630          PRINT "WARNING!! AUTOMATIC FREQUENCY MEASUREMENT SHOULD HAVE WORKED"
1640          DISP "PRESS CONT BUT NOTE THAT LEVEL TRIGGERING MAY FAIL"
1650          PRINT "**********************************************"
1660          PRINT ""
1670          PAUSE
1680        END IF
1690      END IF
1700      RETURN Freq
1710    FNEND
1720    DEF FNVmeter_bw(Freq,Range)
1730      Lvfilter=120000                  !LOW VOLTAGE INPUT FILTER B.W.
1740      Hvattn=36000                     !HIGH VOLTAGE ATTENUATOR B.W.(NUMERATOR)
1750      Gain100bw=82000                  !AMP GAIN 100 B.W. PEAKING CORRECTION!
1760      IF Range<=.12 THEN
1770        Bw_corr=(1+(Freq/Lvfilter)^2)/(1+(Freq/Gain100bw)^2)
1780        Bw_corr=SQR(Bw_corr)
1790      END IF
1800      IF Range>.12 AND Range<=12 THEN
1810        Bw_corr=(1+(Freq/Lvfilter)^2)
1820        Bw_corr=SQR(Bw_corr)
1830      END IF
1840      IF Range>12 THEN
1850        Bw_corr=(1+(Freq/Hvattn)^2)
1860        Bw_corr=SQR(Bw_corr)
1870      END IF
1880      RETURN Bw_corr
1890    FNEND
1900    SUB Err_est(Err,Dist,Freq,Range,Num,Aper,Nbursts)
1910      !
1920      !Base IS THE BASIC NPLC 100 DCV 1YR ACCURACY, THIS NUMBER CAN BE
1930      !SUBSTANTIALLY LOWER FOR HIGH STABILITY OPTION AND 90DAY CAL CYCLES
1940      IF Range>120 THEN                !SELF HEATING +BASE ERROR
1950        Base=15
1960      ELSE
1970        Base=10                        !BASIC 1YR ERROR(ppm)
1980      END IF
1990      !
2000      !
2010      !Vmeter_bw IS ERROR DUE TO UNCERTAINTY IN KNOWING THE HIGH FREQUENCY
2020      !RESPONSE OF THE DCV FUNCTION FOR VARIOUS RANGES AND FREQUENCIES
2030      !UNCERTAINTY IS 30% AND THIS ERROR IS RANDOM
2040      X1=FNVmeter_bw(Freq,Range)
2050      X2=FNVmeter_bw(Freq*1.3,Range)
2060      Vmeter_bw=INT(1.E+6*ABS(X2-X1))  !ERROR DUE TO METER B.W.
2070      !
2080      !
2090      !Aper_er IS THE DCV GAIN ERROR FOR VARIOUS A/D APERTURES
2100      !THIS ERROR IS SPECIFIED IN A GRAPH ON PAGE 11 OF THE DATA SHEET
2110      !THIS ERROR IS RANDOM
2120      Aper_er=INT(1.0*.002/Aper)       !GAIN UNCERTAINTY - SMALL A/D APERTURE
```

```
2130    IF Aper_er>30 AND Aper>=1.E-5 THEN
2140        Aper_er=30
2150    END IF
2160    IF Aper<1.E-5 THEN
2170        Aper_er=10+INT(.0002/Aper)
2180    END IF
2190    !
2200    !
2210    !Sincerr IS THE ERROR DUE TO THE APERTURE TIME NOT BEING PERFECTLY KNOWN
2220    !THIS VARIATION MEANS THAT THE Sinc CORRECTION TO THE SIGNAL FREQUENCY
2230    !IS NOT PERFECT.  ERROR COMPONENTS ARE CLOCK FREQ UNCERTAINTY(0.01%)
2240    !AND SWITCHING TIMING (50ns).  THIS ERROR IS RANDOM.
2250    X=PI*Aper*Freq
2260    Sinc=SIN(X)/X
2270    Y=PI*Freq*(Aper*1.0001+5.0E-8)
2280    Sinc2=SIN(Y)/Y
2290    Sincerr=INT(1.E+6*ABS(Sinc2-Sinc))    !APERTURE UNCERTAINTY ERROR
2300    !
2310    !
2320    !Dist IS ERROR DUE TO UP TO 1% DISTORTION OF THE INPUT WAVEFORM
2330    !IF THE INPUT WAVEFORM HAS 1% DISTORTION, THE ASSUMPTION IS MADE
2340    !THAT THIS ENERGY IS IN THE THIRD HARMONIC.  THE APERTURE CORRECTION,
2350    !WHICH IS MADE ONLY FOR THE FUNDAMENTAL FREQUENCY WILL THEN BE
2360    !INCORRECT.  THIS ERROR IS RETURNED SEPERATELY.
2370    X=PI*Aper*Freq
2380    Sinc=SIN(X)/X
2390    Sinc2=SIN(3*X)/3/X    !SINC CORRECTION NEEDED FOR 3rd HARMONIC
2400    Harm_er=ABS(Sinc2-Sinc)
2410    Dist=SQR(1+(.01*(1+Harm_er))^2)-SQR(1+.01^2)
2420    Dist=INT(Dist*1.E+6)
2430    !
2440    !
2450    !Tim_er IS ERROR DUE TO MISTIMING.  IT CAN BE SHOWN THAT IF A
2460    !BURST OF Num SAMPLES ARE USED TO COMPUTE THE RMS VALUE OF A SINEWAVE
2470    !AND THE SIZE OF THIS BURST IS WITHIN 50ns*Num OF AN INTEGRAL NUMBER
2480    !OF PERIODS OF THE SIGNAL BEING MEASURED, AN ERROR IS CREATED
2490    !BOUNDED BY 100ns/4/Tsamp.  THIS ERROR IS DUE TO THE 100ns QUANTIZATION
2500    !LIMITATION OF THE HP3458A TIME BASE.  IF THIS ERROR WERE ZERO, THEN
2510    !Num*Tsamp= INTEGER/Freq, BUT WITH THIS ERROR UP TO 50ns OF TIMEBASE
2520    !ERROR IS PRESENT PER SAMPLE, THEREFORE TOTAL TIME ERROR=50ns*Num
2530    !THIS ERROR CAN ONLY ACCUMULATE UP TO 1/2 *Tsamp, AT WHICH POINT THE
2540    !ERROR IS BOUNDED BY 1/4/Num
2550    !THIS ERROR IS FURTHER REDUCED BY USING THE LEVEL TRIGGER
2560    !TO SPACE Nbursts AT TIME INCREMENTS OF 1/Nbursts/Freq.  THIS
2570    !REDUCTION IS SHOWN AS 20*Nbursts BUT IN FACT IS USUALLY MUCH BETTER
2580    !THIS ERROR IS ADDED ABSOLUTELY TO THE Err CALCULATION
2590    Tim_er=INT(1.E+6*1.E-7/4/(Aper+3.E-5)/20)!ERROR DUE TO HALF CYCLE ERROR
2600    Limit=INT(1.E+6/4/Num/20)
2610    IF Tim_er>Limit THEN Tim_er=Limit
2620    !
2630    !
2640    !Noise IS THE MEASUREMENT TO MEASUREMENT VARIATIONS DUE TO THE
2650    !INDIVIDUAL SAMPLES HAVING NOISE.  THIS NOISE IS UNCORRELATED AND
2660    !IS THEREFORE REDUCED BY THE SQUARE ROOT OF THE NUMBER OF SAMPLES
2670    !THERE ARE Nbursts*Num SAMPLES IN A MEASUREMENT.  THE SAMPLE NOISE IS
2680    !SPECIFIED IN THE GRAPH ON PAGE 11 OF THE DATA SHEET.  THIS GRAPH
2690    !SHOWS 1 SIGMA VALUES, 2 SIGMA VALUES ARE COMPUTED BELOW.
2700    !THE ERROR ON PAGE 11 IS EXPRESSED AS A % OF RANGE AND IS MULTIPLIED
2710    !BY 10 SO THAT IT CAN BE USED AS % RDG AT 1/10 SCALE.
2720    !ERROR IS ADDED IN AN ABSOLUTE FASHION TO THE Err CALCULATION SINCE
2730    !IT WILL APPEAR EVENTUALLY IF A MEASUREMENT IS REPEATED OVER AND OVER
2740    Noiseraw=.9*SQR(.001/Aper)        !1 SIGMA NOISE AS PPM OF RANGE
2750    Noise=Noiseraw/SQR(Nbursts*Num)   !REDUCTION DUE TO MANY SAMPLES
2760    Noise=10*Noise                    !NOISE AT 1/10 FULL SCALE
2770    Noise=2*Noise                     !2 SIGMA
2780    IF Range<=.12 THEN                !NOISE IS GREATER ON 0.1 V RANGE
2790        Noise=7*Noise                 !DATA SHEET SAYS USE 20, BUT FOR SMALL
2800        Noiseraw=7*Noiseraw           !APERTURES, 7 IS A BETTER NUMBER
2810    END IF
2820    Noise=INT(Noise)+2                          !ERROR DUE TO SAMPLE NOISE
2830    !
```

```
2840    !
2850    !Df_err IS THE ERROR DUE TO THE DISSIPATION FACTOR OF THE P.C. BOARD
2860    !CAPACITANCE LOADING DOWN THE INPUT RESISTANCE.  THE INPUT RESISTANCE
2870    !IS 10K OHM FOR THE LOW VOLTAGE RANGES AND 100K OHM FOR THE HIGH VOLTAGE
2880    !RANGES (THE 10M OHM INPUT ATTENUATOR).  THIS CAPACITANCE HAS A VALUE
2890    !OF ABOUT 15pF AND A D.F. OF ABOUT 1.0%.  IT IS SWAMPED BY 120pF
2900    !OF LOW D.F. CAPACITANCE (POLYPROPALENE CAPACITORS) ON THE
2910    !LOW VOLTAGE RANGES WHICH MAKES FOR AN EFFECTIVE D.F. OF ABOUT .11%.
2920    !THIS CAPACITANCE IS SWAMPED BY 30pF LOW D.F. CAPACITANCE ON THE
2930    !HIGH VOLTAGE RANGES WHICH MAKES FOR AN EFFECTIVE D.F. OF .33%.
2940    !THIS ERROR IS ALWAYS IN THE NEGATIVE DIRECTION, SO IS ADDED ABSOLUTELY
2950    IF Range<=12 THEN
2960      Rsource=10000
2970      Cload=1.33E-10
2980      Df=1.1E-3             !0.1
2990    ELSE
3000      Rsource=1.E+5
3010      Cload=5.0E-11
3020      Df=3.3E-3             !0.33%
3030    END IF
3040    Df_err=2*PI*Rsource*Cload*Df*Freq
3050    Df_err=INT(1.E+6*Df_err)!ERROR DUE TO TO PC BOARD DIELECTRIC ABSORBTION
3060    !
3070    !
3080    !Err IS TOTAL ERROR ESTIMATION.  RANDOM ERRORS ARE ADDED IN RSS FASHION
3090    Err=SQR(Base^2+Vmeter_bw^2+Aper_er^2+Sincerr^2)
3100    Err=INT(Err+Df_err+Tim_er+Noise)              !TOTAL ERROR (ppm)
3110    !
3120    SUBEND
3130    SUB Samp_parm(Tsamp,Aper,Num,Freq,Meas_time,Aper_targ,Nharm_min,Nbursts)
3140    Aper=Aper_targ
3150    Tsamp=1.E-7*INT((Aper+3.0E-5)/1.E-7+.5)        !ROUND TO 100ns
3160    Submeas_time=Meas_time/Nbursts                 !TARGET TIME PER BURST
3170    Burst_time=Submeas_time*Tsamp/(.0015+Tsamp)    !IT TAKES 1.5ms FOR EACH
3180    !                                               SAMPLE TO COMPUTE Sdev
3190    Approxnum=INT(Burst_time/Tsamp+.5)
3200    Ncycle=INT(Burst_time*Freq+.5)                 !# OF 1/Freq TO SAMPLE
3210    IF Ncycle=0 THEN
3220      Ncycle=1
3230      Tsamp=1.E-7*INT(1/Freq/Approxnum/1.E-7+.5)   !TIME BETWEEN SAMPLES
3240      Nharm=INT(1/Tsamp/2/Freq)      !# HARMONICS BEFORE ALIAS OCCURS
3250      IF Nharm<Nharm_min THEN        !NEED TO INCREASE SAMPLE FREQUENCY
3260        Nharm=Nharm_min
3270        Tsamp=1.E-7*INT(1/2/Nharm/Freq/1.E-7+.5)
3280      END IF
3290    ELSE
3300      Nharm=INT(1/Tsamp/2/Freq)      !# HARMONICS BEFORE ALIAS OCCURS
3310      IF Nharm<Nharm_min THEN        !NEED TO INCREASE SAMPLE FREQUENCY
3320        Nharm=Nharm_min
3330      END IF
3340      Tsamptemp=1.E-7*INT(1/2/Nharm/Freq/1.E-7+.5)   !FORCE ALIAS TO OCCUR
3350      !                                               EXACTLY AT Nharm*Freq !!
3360      Burst_time=Submeas_time*Tsamptemp/(.0015+Tsamptemp)
3370      Ncycle=INT(Burst_time*Freq+1)
3380      Num=INT(Ncycle/Freq/Tsamptemp+.5)
3390      IF Ncycle>1 THEN
3400        K=INT(Num/20/Nharm+1)
3410      ELSE
3420        K=0
3430      END IF
3440      Tsamp=1.E-7*INT(Ncycle/Freq/(Num-K)/1.E-7+.5)   !NOW ALIAS OCCURS
3450      !                                                MUCH HIGHER THAN Nharm*Freq
3460      !                                                K WAS PICKED TO TRY AND MAKE
3470      !                                                ALIAS ABOUT 10*Nharm*Freq
3480      IF Tsamp-Tsamptemp<1.E-7 THEN Tsamp=Tsamp+1.E-7
3490    END IF
```

```
3500      Aper=Tsamp-3.E-5
3510      Num=INT(Ncycle/Freq/Tsamp+.5)
3520      IF Aper>1 THEN Aper=1        !MAX APERTURE OF HP3458A
3530      IF Aper<1.E-6 THEN           !MIN APERTURE OF HP3458A
3540         BEEP 200,1
3550         PRINT "************** ERROR *****************"
3560         PRINT "A/D APERTURE IS TOO SMALL"
3570         PRINT "LOWER Aper_targ, Nharm, OR INPUT Freq"
3580         PRINT "**************************************"
3590         STOP
3600      END IF
3610   SUBEND
```

I claim:

1. Method of measuring the voltage of a periodic AC waveform having a period P, the method comprising the steps of:

(a) sampling the voltage AC waveform with a plurality of n-many equally spaced sample, n an integer greater than one, whose sample interval therebetween does not exactly divide P, and the first sample of which is taken upon the occurrence of an iniital selected feature of the AC waveform;

(b) computing an intermediate result from the samples taken in step (a), the intermediate result beign in error by an amount related to where the initial selected featurew is upon the AC waveform;

(c) repeating the steps (d) and (e) below (k−1)-many times, k an integer greater than one;

(d) sampling the voltage of the AC waveform with a plurality of n-many equally spaced sample, the first sample of which occurs upon a new selected feature on the AC waveform that is 1/k of a period P displaced from the previous location of the selected feature;

(e) computing an intermediate result from the samples taken in step (d), the intermediate result being in error by an amount related to where the selected feature is upon the AC waveform; and (f) cancelling the errors in the several intermediate results by finding the mean of the several intermediate results to produce a measurement not containing an error related to where the selected feature is upon the AC waveform.

2. A method as in claim 1 wherein the sampling of steps (a) and (d) are performed over approximately m-many periods of the AC waveform, m an integer greater than zero, and further wherein the sampel interval between the samples does not exactly divide mP.

3. A method as in claim 2 wherein the periodic AC waveform includes harmonic content and wherein the number of samples n taken during the m-many periods mP is selected to suppress the contribution to the measurement of step (f) of harmonic content below a selected order.

4. A method as in claim 2 wherein the periodic AC waveform includes harmonic content and wherein the value of k is selected to suppress the contribution to the measurmeent of step (f) of harmonic content below a selected order.

5. A method as in claim 1 wherein the measuremnet is an RMS value.

* * * * *